United States Patent [19]
Hunter, Jr. et al.

[11] Patent Number: 5,509,553
[45] Date of Patent: Apr. 23, 1996

[54] DIRECT ETCH PROCESSES FOR THE MANUFACTURE OF HIGH DENSITY MULTICHIP MODULES

[75] Inventors: Robert O. Hunter, Jr., Rancho Santa Fe; Adlai H. Smith; Bruce B. McArthur, both of San Diego, all of Calif.

[73] Assignee: Litel Instruments, San Diego, Calif.

[21] Appl. No.: 231,704

[22] Filed: Apr. 22, 1994

[51] Int. Cl.$^6$ .................................................. H01B 13/00
[52] U.S. Cl. ............................. 216/13; 216/45; 216/65
[58] Field of Search ................................. 156/643, 655, 156/656, 659.1, 661.1, 901, 902, 345; 219/121.68, 121.69, 121.85; 216/13, 14, 65, 67, 45

[56] References Cited

U.S. PATENT DOCUMENTS

| | | | |
|---|---|---|---|
| 4,508,749 | 4/1985 | Brannon | 156/643 X |
| 5,378,313 | 1/1995 | Pace | 156/643 |

OTHER PUBLICATIONS

Podlesnik, Dragan V., et al. (1986) "Waveguiding effects in laser–induced aqueous etching of semiconductors", *Appl. Phys. Lett.*, (48:496–498).
Treyz, G. V., et al. (1988) "Rapid direct writing of high–aspect ratio trenches in silicon: Process physics", *J. Vac. Sci. Technol.*, 6:37–44.
Bachmann, Friedrich G. (1990) "Generation of Blind Via-Holes For A High Density Multi–Chip Using Excimer Lasers", *Mat. Res. Soc. Symp. Proc.*, 158:439–450.
Greenstein, Michael, et al. (1991) "A Precision Vertical Interconnect Technology", *IEEE Transactions on Components, Hybrids, and Manufacturing Technology*, 14:445–451.
Tam, A. C., et al. (1991) "Efficient laser cleaning of small particulates using pulsed laser irradiatino synchronized with liquid–film deposition", *SPIE*, 1598:13–18.
Tessier, T. G., et al. (1991) "Via Processing Options or MCM–D Fabrication: Excimer Laser Ablation vs. Reactive Ion Etching", *IEEE*, 827–834.
Messner, George, et al. (1992) *Thin Film Multichip Modules*, International Society of Hybrid Micorelectronics, Reston, VA.
Tessler, T. G., et al. (1992) "Compatibility of Common MCM–D Dielectrics with Scanning Laser Ablation Via Generation Processes", 1–7, (paper presented at the 42nd ECTC).
Product brochure, "Core–2000", ATEQ Corporation, 9555 S. W. Gemini Dr., Beaverton, OR 97005.
Product brochure, "Core–2500", ATEQ Corporation, 9555 S. W. Gemini Dr., Beaverton, OR 97005.
DARPA/EIA/SEMI Workshop Materials, Feb. 4, 1993.
Seminar materials, "Laser Processing & Technologies", from the 4th San Diego Saturday Seminar, IEEE Components, Hybrids, and Manufacturing Technology Society, San Diego Chapter, San Diego, CA, Nov. 3, 1991.

*Primary Examiner*—William Powell
*Attorney, Agent, or Firm*—Townsend and Townsend and Crew

[57] ABSTRACT

The process of the manufacture of both the conductive layers and dielectric layers of multichip modules of the deposited variety is set forth with direct etch techniques being substituted for photolithography. Simply stated, entire circuit layers of the modules are directly etched or patterned with the circuit configuration required. Three processes are disclosed for processing the individual layers including subtractive patterning of a metallic conductor layer and direct patterning of the dielectric layer; direct etch metal processing (DEMI) involving direct removal of the metal layer with subsequent direct patterning of the dielectric layer; and, plating form process involving additive metallization and direct etching of the dielectric layer. By utilizing the disclosed processes alone or in combination, fabrication of multichip modules can occur.

50 Claims, 9 Drawing Sheets

5,509,553

DIRECT ETCH PROCESSES FOR THE MANUFACTURE OF HIGH DENSITY MULTICHIP MODULES

This invention relates to the manufacture of high wire density interconnect structures for multichip modules of the deposited variety (MCM-Ds). These modules are high circuit density packages for surface-mounted, unpackaged or bare, integrated circuit chips. The manufacture of such multichip modules involves depositing and patterning thin metal and dielectric films on a rigid supporting substrate.

BACKGROUND OF THE INVENTION

The article, "Thin Film Multichip Modules", G Messner, I. Turlik, J. Balde, P. Garrou, *International Society for Hybrid Microelectronics,* 1992 discusses a number of processes which are representative of current multi-chip module, deposited (MCM-D) manufacture. All of these processes utilize photolithography in defining at least one of the layers, either of the conductive or dielectric variety.

FIG. 1 illustrates the 5 step process for photolithographic patterning of a dielectric layer. Photolithographic patterning of metal layers involves a similar sequence of steps.

Referring to FIG. 1A, substrate S has previously patterned metal M deposited thereon. Deposition of dielectric D to be patterned has occurred. Proceeding to FIG. 1B, photoresist P is deposited. At FIG. 1C, an image causes the photoresist to be exposed at intervals 14. Development occurs with removal of photoresist from intervals 14 in FIG. 1D. This is followed by etch of the dielectric to leave dielectric channels 15 in FIG. 1E followed by the stripping of the photoresist in FIG. 1F.

The reader will understand that had photoimageable polyimide been used instead of photoresist, only the expose and develop steps of FIGS. 1C and 1D would have been utilized.

The repeating of the sequence of photolithographic steps similar to those set forth above is required for the fabrication of multichip modules. For example, multichip module constructions are known which have sixteen (16) layers.

It can therefore be understood that one drawback of photolithographic processing is that multiple steps (2 for photo-imageable polyimide, 5 when photoresist is used) intervene between depositing the layer to be patterned and the resulting permanent structures impressed in that layer. The number of process steps reduces yields and makes process monitoring and trouble shooting difficult.

Photolithographic processes of various complexity are utilized in the prior art. For example, from the above "Thin Film Multichip Modules", a summary has been prepared of the number of processes steps per metal/dielectric layer required by different manufacturer's processes. This summary is presented in tabular form herein:

TABLE 1

List of number of process steps required by different manufacturers to deposit and pattern a single MCM-D metal and dielectric layer.

| Process | Steps per Metal/Dielectric Layer |
| --- | --- |
| GE | 8 |
| MCNC | 14 |
| MCC | 15 |
| Tektronix | 15 |

TABLE 1-continued

List of number of process steps required by different manufacturers to deposit and pattern a single MCM-D metal and dielectric layer.

| Process | Steps per Metal/Dielectric Layer |
| --- | --- |
| NTT | 10 |
| RPI | 11 |
| CNET | 10 |
| Alcoa | 15 |
| Polycon | 12 |

A greater number of process steps translates directly into lower throughput and larger amounts of work in progress for the manufacturer.

MCM-Ds offer the greatest potential performance of current MCM technologies. However, a principal barrier to wider spread use has been the cost and complexity required for their construction utilizing the conventional photolithographic techniques.

SUMMARY OF THE INVENTION

The process for the manufacture of both the conductive layers and dielectric layers of multichip modules of the deposited variety is set forth with direct patterning techniques being substituted for photolithography. Simply stated entire circuit layers of the modules are directly patterned with the circuit configuration required. Three processes are disclosed for producing the patterned metal/dielectric layers. They are:

1. Subtractive Metal (SM);
2. Plating Form Process (PFP); and,
3. Direct Etch Metal Processing (DEMP).

By omitting photolithography all together, the disclosed processes have advantages over the prior art. For example, after the disclosed patterning steps it is possible to immediately inspect the resulting permanent structures. Defects are immediately apparent and not masked by the intervening steps of exposure, developing, and required stripping of photosensitive compounds.

The disclosed techniques are useful for planar and non-planar structures, the latter generally being unsuitable for photolithography.

Further, the disclosed processes are especially adaptable to prototyping of parts; at the same time they may readily be converted to large scale production. Moreover, the processes are useful with a wide variety of materials. Further, the disclosed processing has decreased sensitivity to dust. The number of steps and the quantity of capital tools are reduced resulting in higher yields and throughput of product. Further, work in progress and inventories can be reduced. Because fewer process steps are involved, improved process monitoring and trouble shooting can result. Further, the disclosed direct patterning techniques enable wider processing latitude.

DESCRIPTION OF THE PREFERRED EMBODIMENT

Figure 1A:
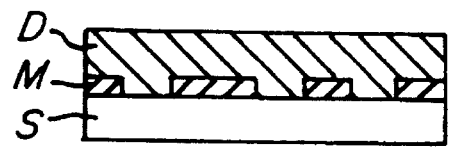
FIGS. 1A–1F are respective schematic illustrations of the prior art use of photolithography for patterning of a dielectric layer on a multichip module of the deposited variety.
Figure 1B:
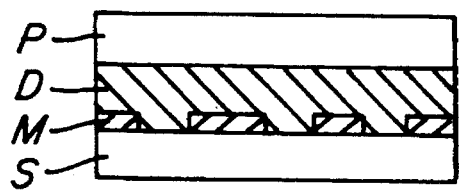
Figure 1C:
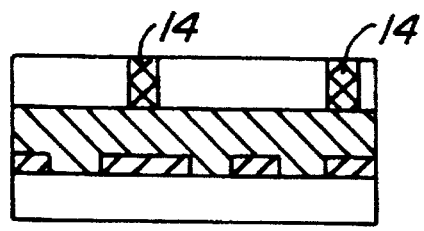
Figure 1D:
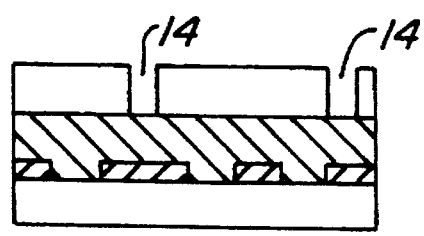
Figure 1E:
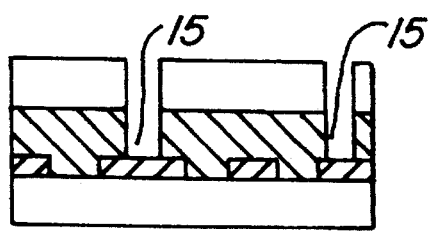
Figure 1F:
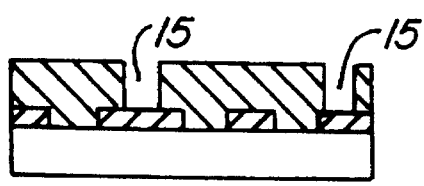
Figure 2A:
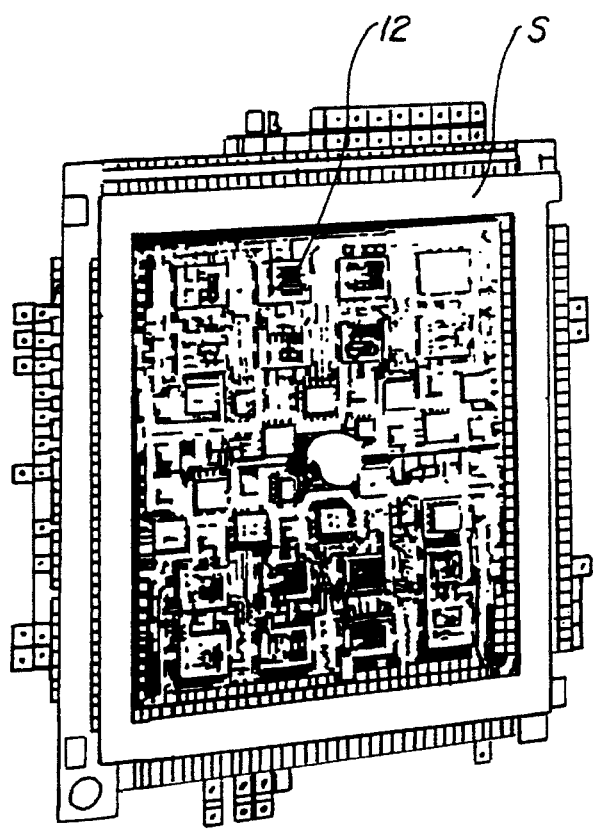
FIG. 2A is a perspective view of a multichip module having chips attached for operation on a common substrate.

Referring to FIG. 2A, a typical multichip module is illustrated. It can include multiple layers of dielectric and conductive patterning (4 such layers are common) on a substrate S. As will here after more fully be explained, the respective layers form together with various vertical interconnects a matrix of chip interconnections that can result in complex function—such as that required for the central processing unit of a large computer. Typically, a plurality of chips, 12, are mounted to the package.

In our previously filed patent application Ser. No. 08/058,906 filed May 6, 1993, now U.S. Pat. No. 5,364,493, entitled APPARATUS AND PROCESS FOR THE PRODUCTION OF FINE LINE METAL TRACES, we have set forth an apparatus and process which is compatible with the production processes set forth herein. Accordingly, that application is incorporated herein by reference.

Figure 2B:
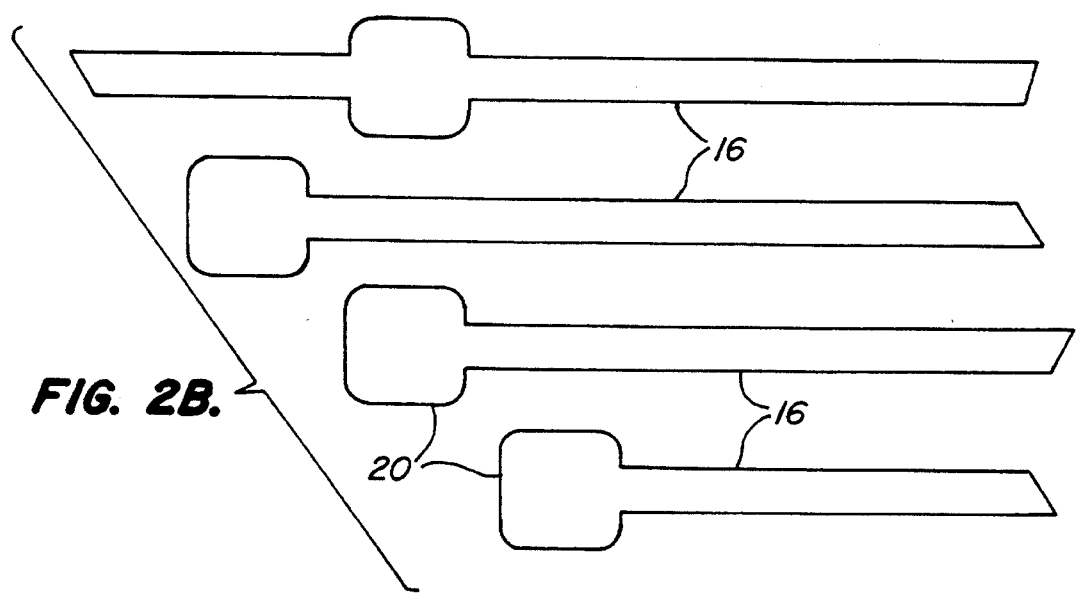
FIG. 2B is a representative signal layer of a multichip module illustrating in only partial detail at one layer some of the metal geometry required for multichip modules.

Referring to FIG. 2B, a portion of a circuit indicative of those utilized in the multichip modules is set forth. It includes conductive strips 16 and pads 20. Strips 16 provide the required electric communication; pads 20 are typically the terminus of required vertical interconnects connecting conductors and mounted chips in the various layers.

By way of example only, in the fabrication of conductive layers 16, removal would occur of a metal layer save and except for the conductive layers 16 and pads 20. This is the equivalent of saying that removal in the negative image of the conductive layers 16 and pads 20 occurs.

Figure 2C:
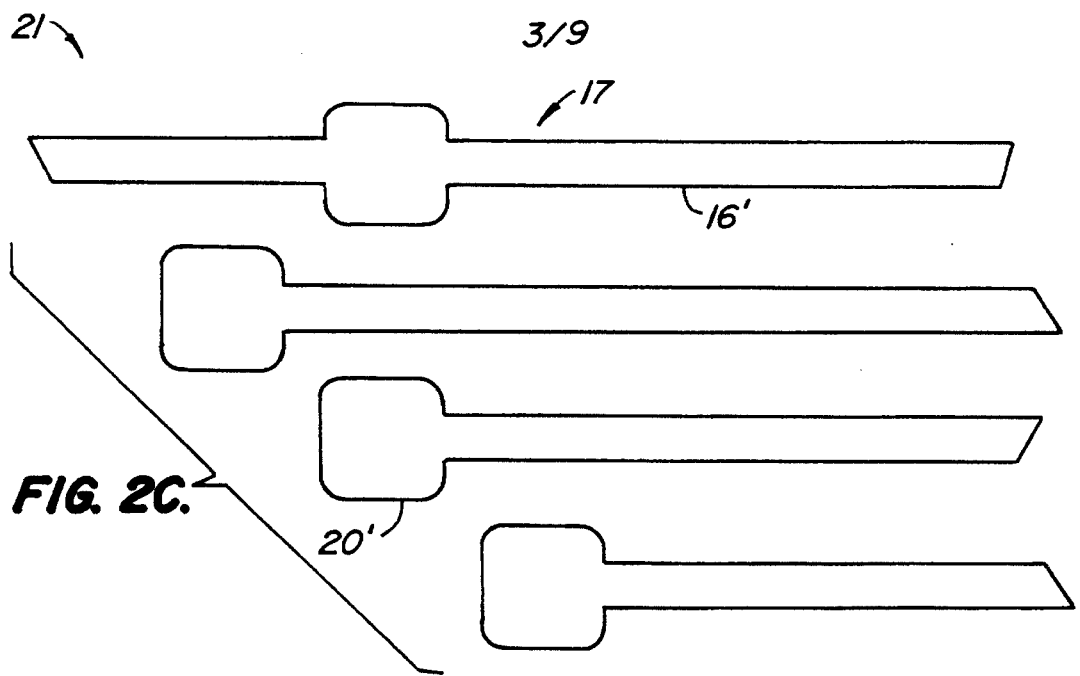
FIG. 2C is a representative computer generated hologram for having coherent light incident thereon for producing the represented pattern of FIG. 2B to produce the required direct ablation required for the process of this invention.

Referring to FIG. 2C, the construction of a mask necessary for the patterning can be understood. Quartz plate 21 is provided with diffractive structures (in this case gratings) 17 filling in the precise pattern of conductive strips 16 and pads 20 of FIG. 2B. Thus, quartz plate 21 will transmit light that will ablate a metal or etch block layer which is the negative image of the desired conductive strips 16 and pads 20 of FIG. 2B. In the case an etch block is patterned, the workpiece is then etched to remove the exposed metal.

A mask that is the functional equivalent to that illustrated in FIG. 2C is set forth in patent application Ser. No. 07/833,939 entitled High Power Phase Masks for Imaging Systems filed Feb. 10, 1992, now U.S. Pat. No. 5,328,785 issued Jul. 12, 1994.

Figure 2E:
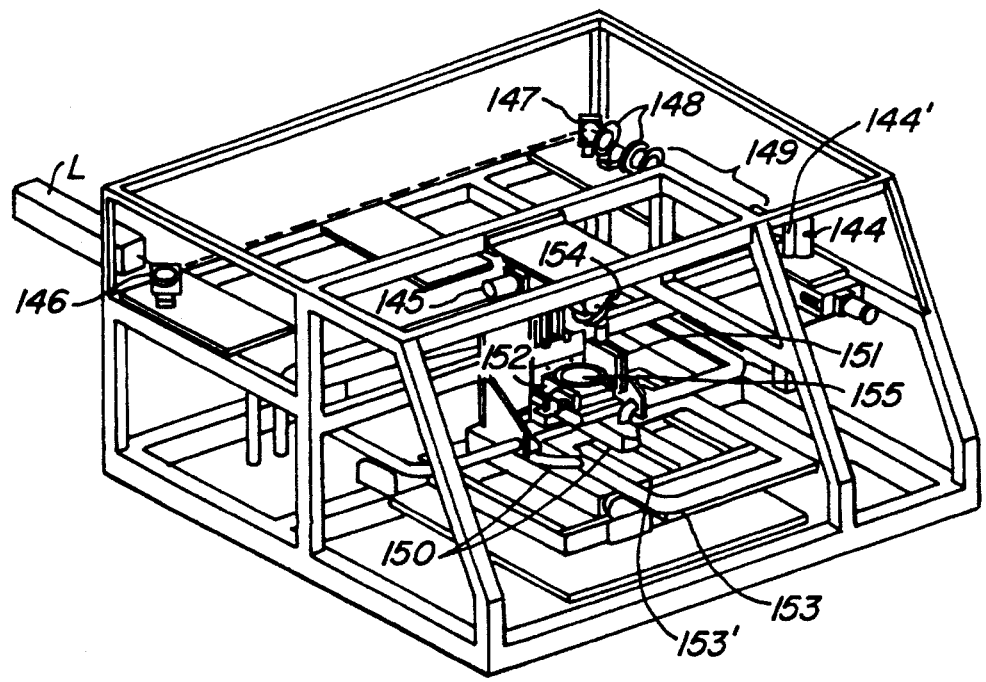
FIG. 2E is a perspective view of apparatus for ablating the required vertical interconnects for such modules.
Figure 2D:
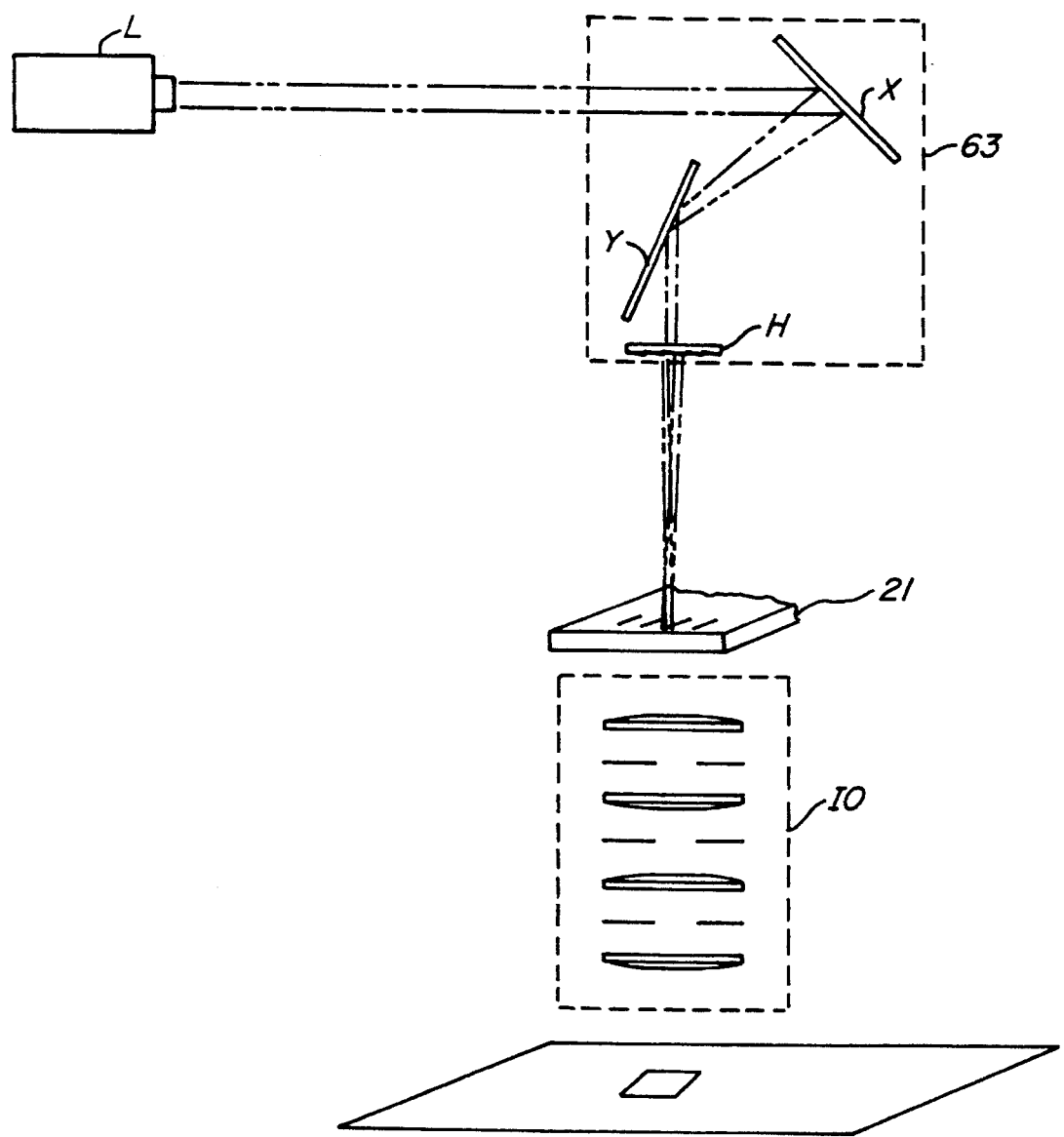
FIG. 2D is a schematic of an apparatus for producing the direct ablation here required including the scanning of the computer generated hologram of FIG. 2C for the direct ablation of the layer of FIG. 2B.

Apparatus for effecting such ablation is illustrated in FIG. 2D, a variation on the apparatus taken from our previously filed APPARATUS AND PROCESS FOR THE PRODUCTION OF FINE LINE METAL TRACES. Laser L sends light through X, Y scan apparatus 63 including a beam homogenizing plate H. The light is then incident on plate 21 and is scanned. Imaging objective IO is also translated synchronously with the scanners 63. Imaging objective IO only passes the light not diffracted by gratings, 16' and 20', disposed on mask 21. It will be understood that the etch of either dielectric, etch block, or metal form, or metal itself can be effected with this apparatus.

As will hereafter become apparent, once one or more of the individual metal layers of multichip modules has been configured, it is necessary to form vertical interconnects—again by ablation. Accordingly, FIG. 2E is a perspective view of the apparatus of this invention. This figure is taken from our co-pending patent application Ser. No. 08/121,060 filed Sep. 14, 1993, entitled APPARATUS AND PROCESS FOR USING FRESNEL ZONE PLATE ARRAY FOR PROCESSING MATERIALS. This application is incorporated herein by reference.

Laser L is chosen based upon the absorption characteristics of the work piece as well as the desired beam divergence and uniformity. The laser beam is directed by folding mirrors 146 and 147 into beam collimating lenses 149 and beam expanding lenses 148. Folding mirrors 144 and 154 then direct the beam to phase mask 155. Plate 155 is mounted to angular or Q positioner 152. After the beam is shaped by plate 155, it impinges on substrate S. Substrate S is mounted to an XY stage 153. Duct 150 is used either to direct air onto the work piece or to exhaust fumes away from the work piece. It is also possible to use two separate duct systems so that the functions of blowing and exhausting can be performed simultaneously. If debris is not removed during the processing of the work piece, it is possible for portions of the work piece to be partially obscured, resulting in an incomplete pattern being formed.

Figure 2F:
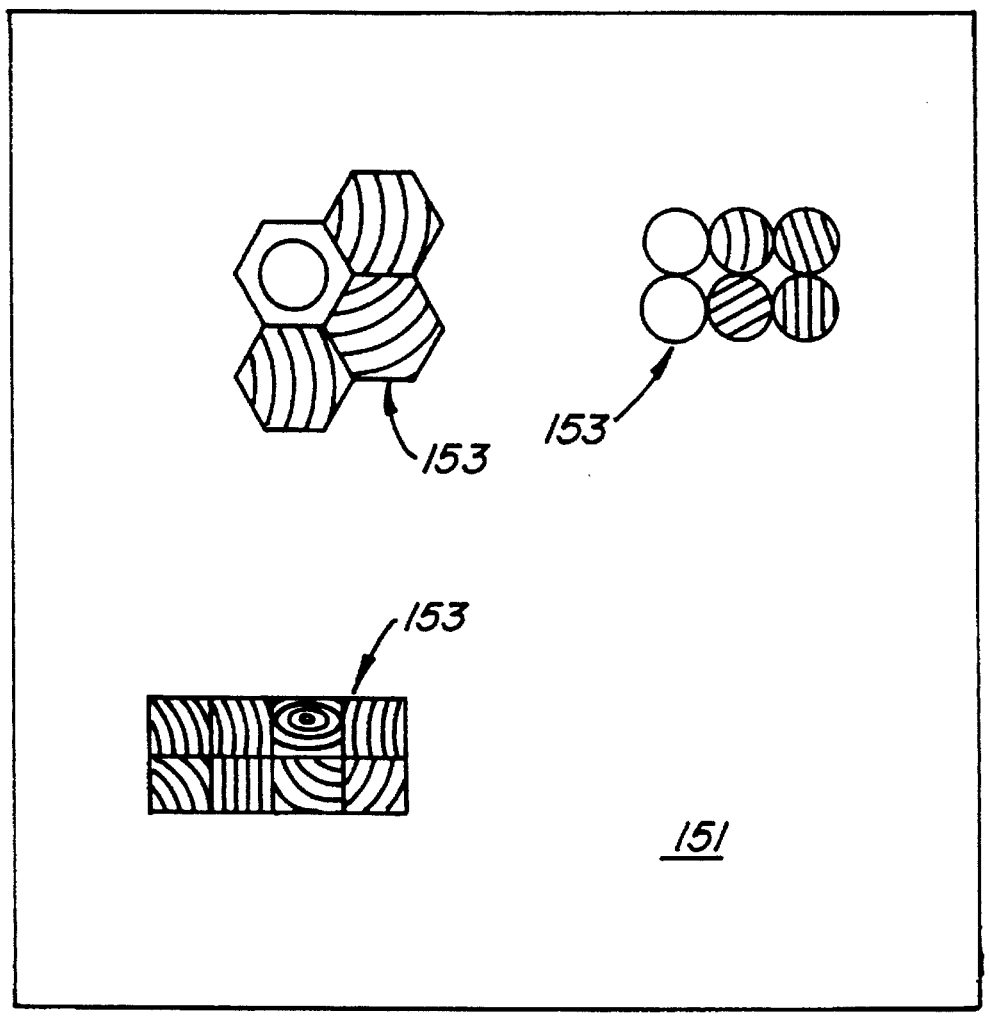
FIG. 2F illustrates a typical plate that can be used in the ablation of the vertical interconnects.

Referring to FIG. 2F, a typical phase mask 151 is illustrated. This plate has sufficient subapertures so that desired formation of vertical interconnects can occur. Since the function of holographic plates such as that illustrated in FIG. 2F are fully described in U.S. patent application, Ser. No. 08/175,052 filed Dec. 29, 1993 entitled GENERALIZED GEOMETRIC TRANSFORMS FOR COMPUTER GENERATED HOLOGRAMS. Such descriptions will not be repeated here save and except to say that plate 151 at subapertures 153 forms working images of the desired vias in space. These images are registered to the desired substrate, S, and vias are formed. Such via formation may occur on a hole by hole basis—or a plate may be configured for scanning which when scanned will form the apertures desired for any single stage of the required processing.

This completes the general description of the required apparatus necessary for the direct ablation of the various layers required herein. In what follows, discrete processes will be set forth. It will be left to the reader to make the adaptation of the processes to the illustrated apparatus or their equivalent.

Subtractive Metal

Figure 3:
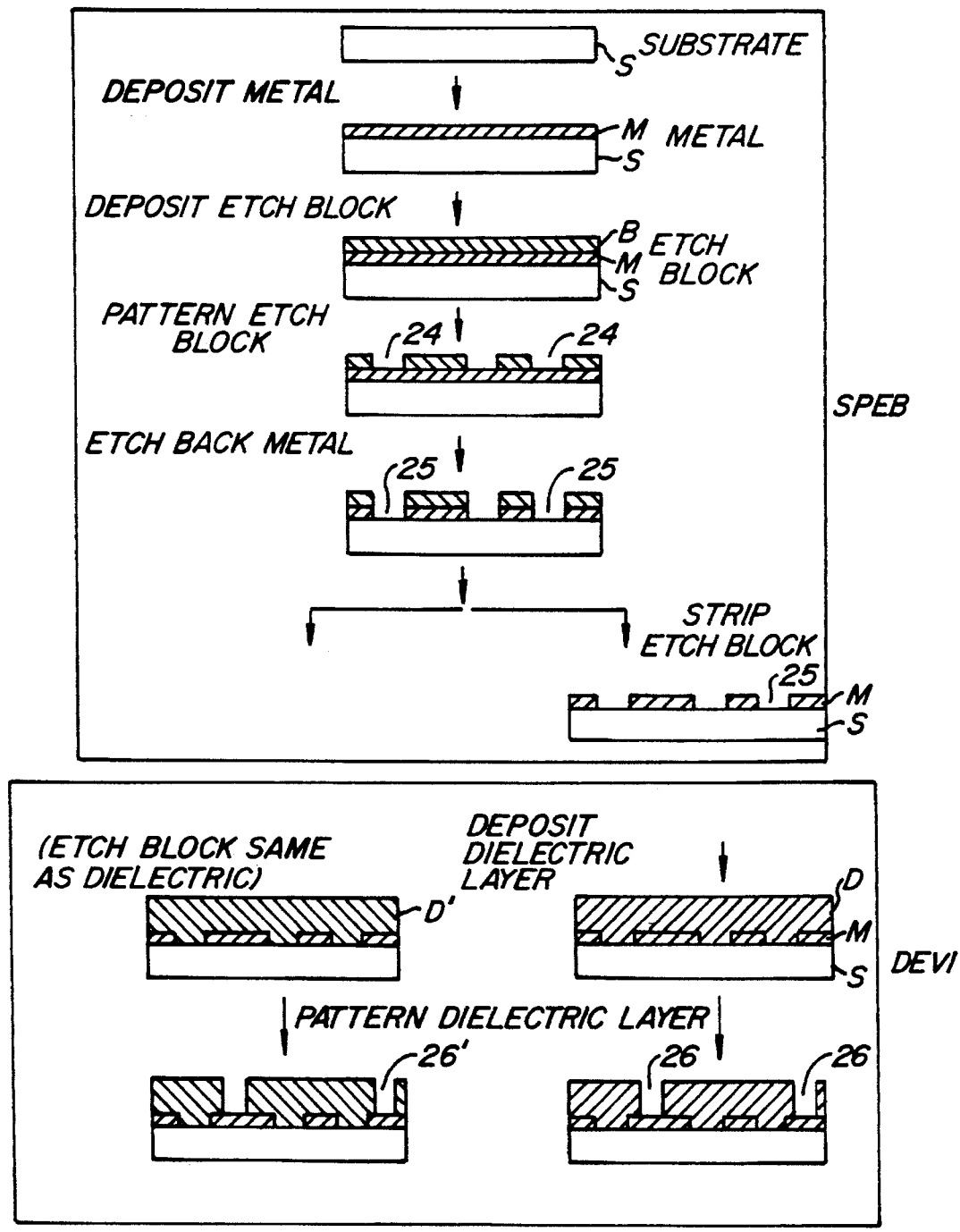
FIG. 3 is a schematic diagram showing in cross section only the process steps of this invention for MCM manufacture utilizing subtractive metal etching (SM)

Process steps for MCM manufacture utilizing subtractive metal etching, hereafter abbreviated SM, are illustrated by FIG. 3. Substrate S is first provided. Substrate S has metal M deposited thereon. Thereafter, etch block B is deposited on metal M. Deposition of etch block B is followed by patterning of etch block B at intervals 24. This occurs by direct laser ablation.

Once patterning has occurred, the metal is etched back where exposed (25). Two simple variants of the process are utilized. In the first variant, the etch block B is not removed but dielectric D' is deposited on the surface. The second variant consists of stripping etch block B followed by deposition of dielectric D. At this point, the dielectric layers having been deposited we can proceed with the second set of process steps. This second set of process steps consists is denoted DEVI which stands for direct etch manufacture of vertical interconnects.

DEVI consists of directly etching the vertical interconnects in the dielectric by ablation.

Those having skill will under stand that overall the subtractive metal process (SM) is a 6 or 7 step process. The corresponding process using photolithography to define both the metallization and dielectric layer would require 12 steps.

Referring to FIG. 3, materials are substrate S, metal M and etch block B. Process steps are sequentially metal deposition, etch block deposition, etch block patterning, metal etch,(possibly) etch block strip, dielectric deposition, and dielectric patterning.

When used with a scanning ablation tool, this subtractive patterning with etch block (SPEB) sub-process is set forth in our co-pending U.S. patent application Ser. No. 08/058,906 filed May 6, 1993 entitled APPARATUS AND PROCESS FOR THE PRODUCTION OF FINE LINE METAL TRACES, now U.S. Pat. No. 5,364,493 issued Nov. 15, 1994.

Regarding the term "direct patterning", we refer to the direct ablation of materials by high intensity light—which preferably is coherent light utilizing a laser. Such direct patterning is disclosed in our co-pending patent applications entitled USE OF FRESNEL ZONE PLATES FOR MATERIALS PROCESSING, Ser. No. 07/612,212 filed Nov. 9, 1990, now Ser. No. 07/940,008 filed Sep. 3, 1992, now U.S. Pat. No. 5,367,940, the use of computer generated holograms is set forth. In the preferred embodiment, a plate containing a plurality of holograms is disclosed. Such holograms are confined to subapertures and scanned by coherent light to produce from the subapertures as they are scanned the desired working images for processing materials.

In a Continuation-In-Part patent application Ser. No. 08/177,356 filed Jan. 3, 1994, improved techniques of dimensioning and fabricating the subaperture, creating amplitude modulation with the phase plate, and finally controlling amplitude with optical features close to the limit of producible optical elements are disclosed. The apparatus for the process, the process and the plate for utilization in the process are set forth.

In the direct ablation of materials, the processes of these applications can be utilized for the required direct ablation. Accordingly, the disclosures of these references are incorporated herein by reference.

The materials that can be utilized with these disclosed processes can readily be understood. Substrate S can by way of example include glass, ceramic, alumina, silicon, glass-ceramic, and/or copper with dielectric coating. Furthermore, substrate S may have already disposed on it, passive and active electrical devices such as resistors, capacitors or transistors.

For simplicity of manufacture (especially for single layer packages), the substrate may already be provided with metal and etch block layers already disposed on it. The preferred embodiment uses alumina as substrate S. Also, it will be understood that substrate S in general can contain both active and passive circuit components such as MOs capacitors, resistors, diodes or transistors.

Regarding the metals which can be used with the disclosed processes they include copper, aluminum, Cu/Al, gold. The preferred embodiment uses aluminum. In addition to their electrical properties, it is desirable that the metal be capable of withstanding the power levels utilized to remove the etch block. This etch stop property of the metal layer allows for wide process latitude since exposure beyond that nominally required to pattern the etch block B will not affect the underlying metal M. Accordingly, the preferred embodiment uses aluminum sufficiently thick (>1 μm) that it serves as an etch stop.

Etch block includes screen printing ink, shellac, polyvinylidene chloride (Saran Wrap®), photoresist, polyimide, benzocyclobutene (BCB), polyphenylquinoxaline (PPQ), and doped or modified versions of these materials. Since ablation is the preferred mechanism for removal of these materials, they respond to removal when the fluence is above a certain threshold value.

Regarding the metal deposition useful with this process, they include sputtering, sputtering followed by plateup, vacuum deposit and plateup, or other known processes which will result in the required metal layer. Sputtering alone is preferred.

For the application of the etch block, conventional squeegee/screen application, spin coating, spray coating, or other known processes of deposition may be utilized. Spin coating is preferred.

Masked based etch block patterning utilizes light energy having sufficient energy to directly ablate the materials. This mask based etch block patterning is generally the preferred method of manufacture when high product throughput is required. Apparatus which can be used in this part of the process include phase mask machining utilizing lensless computer generated holograms (CGHs), scanning imaging systems, and fixed field step and repeat imaging systems. An important requirement is that the light energy itself be sufficient to cause material removal—usually through ablation. Scanning imaging systems are preferred such as those disclosed in our co-pending U.S. patent application Ser. No 08/058,906 filed May 6, 1993 entitled APPARATUS AND PROCESS FOR THE PRODUCTION OF FINE LINE METAL TRACES, now U.S. Pat. No. 5,364,493 issued Nov. 15, 1994.

Programmable etch block patterning is the preferred technique for production of small lots or creating functional prototypes. One method for programmable production include phase mask machining utilizing addressable masks as set forth in our co-pending patent application entitled APPARATUS AND PROCESS FOR USING FRESNEL ZONE PLATE ARRAY FOR PROCESSING MATERIALS, Ser. No. 08/121,060 filed Sep. 14, 1993.

A second method utilizes laser beams which through opto-mechanical addressing schemes can programmably ablate the required pattern. One example of such opto-mechanical addressing is the technology incorporated in Electro Scientific Industries Model 4200 Laser Trimming System of Portland, Oreg. which utilizes high speed galvanometers to programmably address the workpiece. Another example of such opto-mechanical addressing is the technology incorporated in Electro Scientific Industries Model 44PLUS Laser Trimming System which utilizes linear motors to programmably address the workpiece. A third example of programmable patterning utilizes a combination of mechanical scanning and acousto-optic scanning. An example of such a system would be an adaptation of the technology in ATEQ Corporation's CORE-2500 Optical Lithography System of Beaverton, Oreg. to direct patterning. Phase mask machining utilizing programmable computer generated holograms is the preferred technique.

The metal etching steps can include wet chemical etch or reactive ion etch (RIE). Wet etch is preferred utilizing standard techniques.

Steps for Plate Form Process (PFP)

Figure 4:
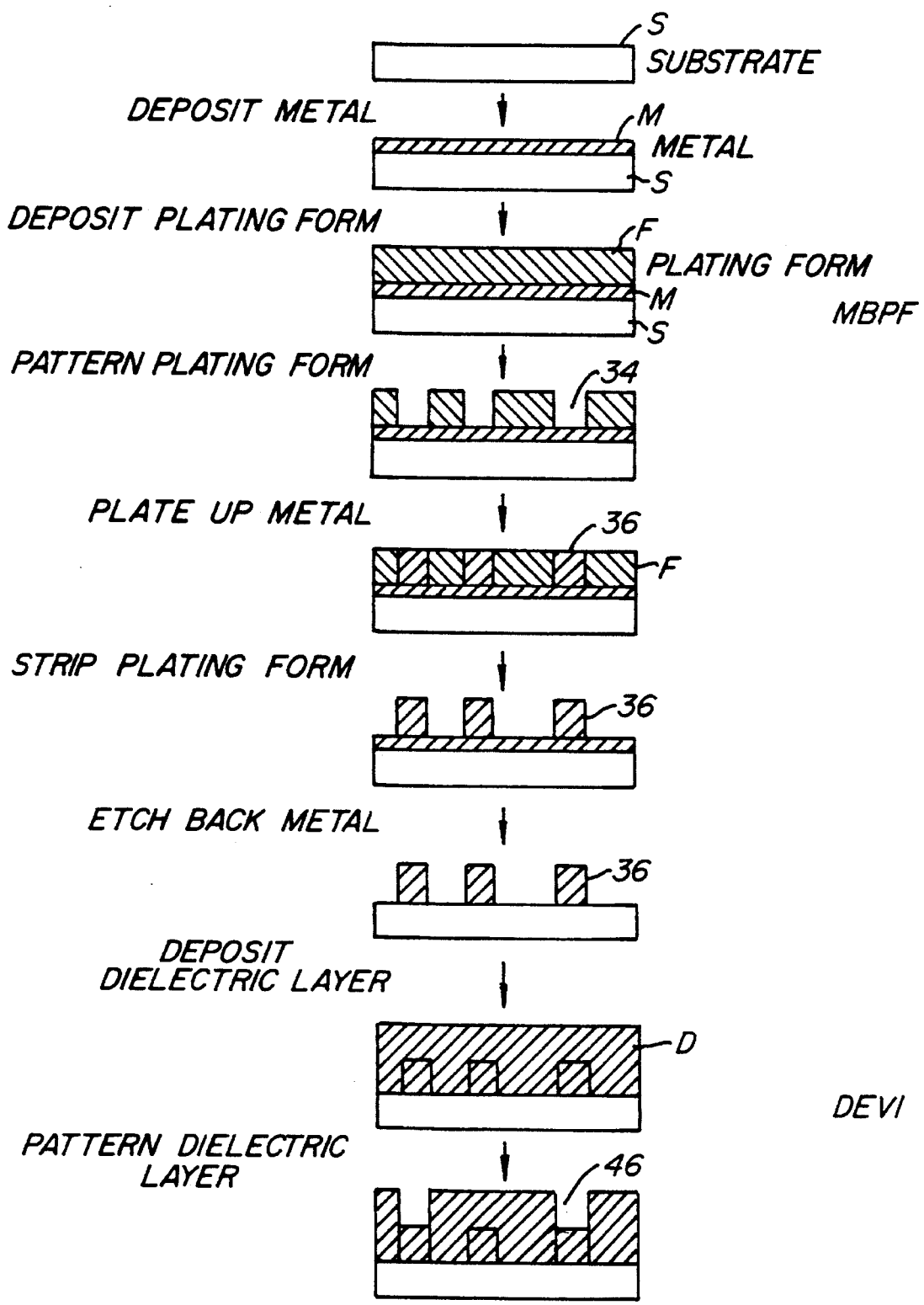
FIG. 4 is a schematic diagram showing in cross section only the process steps for MCM-D manufacture utilizing the plating form process.

FIG. 4 illustrates the process steps for multichip module fabrication utilizing the plating form process. This sequence of steps is hereafter referred to by its abbreviation (PFP). The process steps consist of providing substrate S and thereafter depositing metal M. Thereafter, plating form F is deposited and patterned at intervals 34. Once patterning has occurred, plating up intervals 34 with plated extensions 36 occurs. Thereafter, plating form F is stripped, and metal M etched back. This is followed by the direct etch of vertical interconnects (DEVI) subprocess whereby dielectric D is deposited and thereafter directly patterned with the vertical interconnects 46.

Overall, this is an 8 step process. The corresponding process using photolithography to define both the metallization and dielectric layer would require 12 steps.

In FIG. 4, the series of (PFP) steps are broken into 2 sub-processes, metallization by plating form (MBPF) and direct etch manufacture of vertical interconnects (DEVI).

Materials utilized are substrate, metal, and plating form. Process steps are metal deposition, plating form deposition, plating form patterning, metal plate up, plating form strip, metal etch back, dielectric deposition and dielectric patterning. When used with a scanning ablation tool, this process is set forth in our co-pending U.S. Pat. application Ser. No. 08/058,906 filed May 6, 1993 entitled APPARATUS AND PROCESS FOR THE PRODUCTION OF FINE LINE METAL TRACES as "Etch Enhancement", or alternatively as "Laser Form Ablation Followed by Plating". Accordingly, that reference is incorporated herein by reference as if fully set forth herein.

The materials utilized for the substrate can include substrates such as glass, ceramic, alumina, silicon, glass-ceramic, copper with dielectric coating. For simplicity of manufacture (especially for single layer packages), the substrate may already be provided with metal and plating form layers already disposed on it. Preferred embodiment uses alumina. Also, the substrate in general contains both active and passive circuit components such as MOs capacitors, resistors, diodes or transistors.

Metals can include copper, aluminum, CU/AL, gold. Preferred embodiment uses aluminum. In addition to their electrical properties, it is desirable that the metal be capable of withstanding the power levels utilized during subsequent dielectric patterning. This etch stop property of the metal layer allows for wide process latitude since exposure beyond the nominal will not affect the underlying metal layer. The preferred embodiment uses aluminum sufficiently thick (>0.5 μm) that it serves as an etch stop.

Plating form materials can include photoresist, polyimide, benzocyclobutene (BCB), polyphenylquinoxaline (PPQ), and doped or modified versions of these materials. Since ablation is the preferred mechanism for removal of these materials, they respond to removal when the fluence is above a certain threshold value characteristic of the material.

Metal deposition techniques suitable for use with this process include sputtering, sputtering followed by plateup, vacuum deposit and plateup, and other known processes. Sputtering alone is preferred.

Plating form application can include spin coating, spray coating, and other known processes. Spin coating is preferred.

Plating form patterning can utilize conventional masks. Additionally a scanning ablation tool as set forth in our co-pending U.S. patent application Ser. No. 08/058,906 filed May 6, 1993 entitled APPARATUS AND PROCESS FOR THE PRODUCTION OF FINE LINE METAL TRACES can be utilized. Further, a fixed field can be scanned, stepped, and repeated. Scanning imaging systems are preferred.

As before, programmable plating form patterning can include programmable computer generated holograms (CGH), opto-mechanical scan systems, and acousto-optic scan systems. Programmable computer generated holograms CGH are preferred.

For the metal plate up electroless and electrolytic plating can be utilized. Electroless plating is preferred.

Plating form stripping can be accomplished by laser scanning, wet or dry chemical stripping. Wet stripping is preferred.

Metal etch back can include wet or dry processes, wet processes being preferred.

The sequence of steps outlined above is repeated as many times as necessary so that the appropriate metal and via structures are obtained.

The final step in manufacture involves a repeat of the metallization step resulting in mounting pads to which bare die of the subsequently mounted chips are connected by any of a number of standard methods.

Figure 6A:
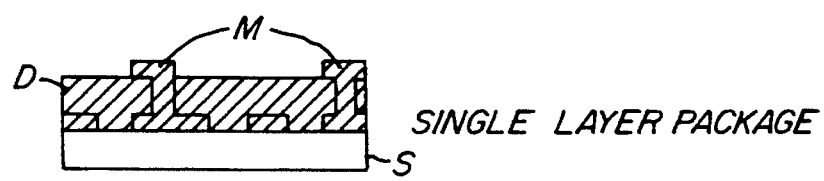

The reader will understand that the result of these processes is a single or multi-layer package (FIG. 6) to which chips are then bonded. These process steps have been outlined for producing MCM-D packages. They can also be applied, with suitable modifications, to manufacture of flat panel displays and to microelectronic chips themselves.

Steps for DEMP process

The final technique set forth herein is a method for multichip module manufacture that utilizes direct etch metal processing (DEMP). Hereafter this process as illustrated by FIG. 5 is referred to as DEMP.

Figure 5A:
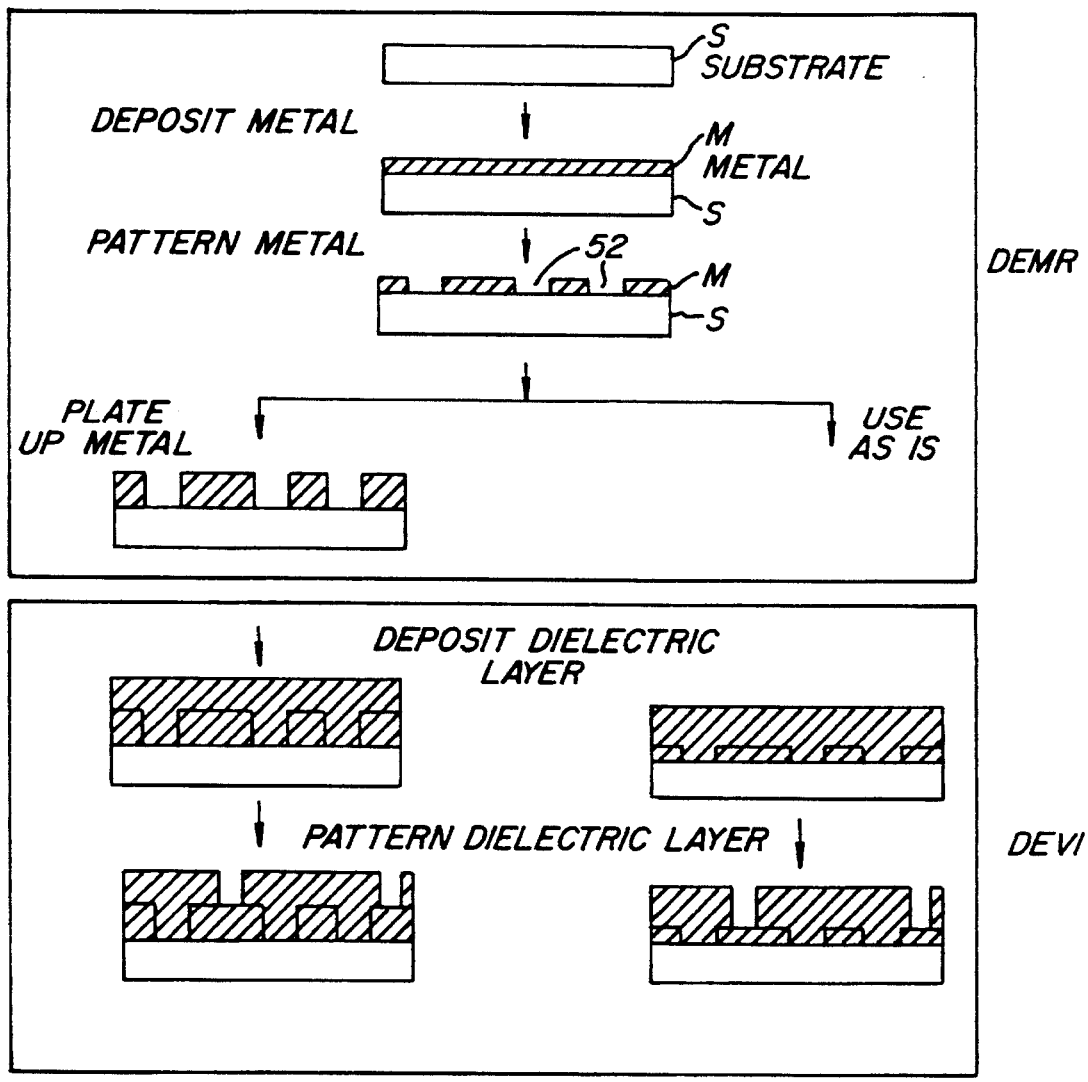
FIG. 5A is a schematic diagram showing in cross section only the process steps for MCM-D manufacture utilizing direct etch metal processing.
Figure 5B:
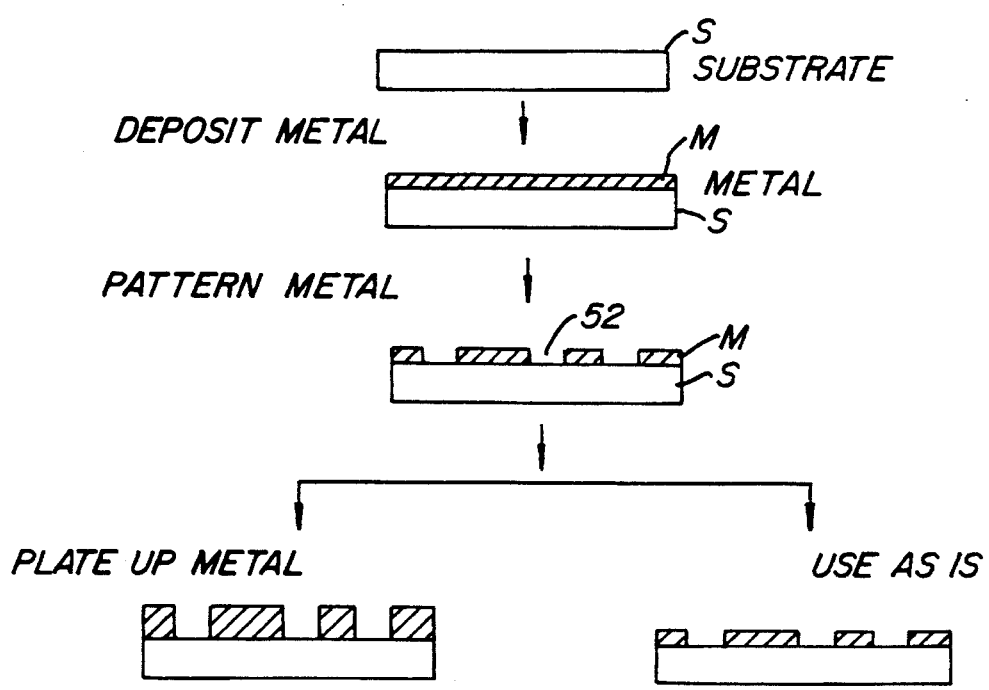
FIG. 5B is a schematic diagram showing in cross section only the direct etch metal removal process; and, FIGS. 6A and 6B are illustrations respectively in cross section of a single layer package and two layer package of multichip module construction with the constructions illustrating the placement of so-called "pads" for providing areas for electrical connection.

Process steps for DEMP are illustrated by FIG. 5. Substrate S is provided and covered with metal M. Thereafter, metal M is directly patterned with intervals 52. In a first variation of the process, the substrate S with metal M patterned at intervals 52 can be used as is.

The second variant can include using the metal without additional plating.

With the metal patterned according to one of these two variants, the process steps of direct etch of vertical interconnects (DEVI) are then executed. There results a patterned metal/dielectric layer.

Overall, this process has only 5 or 6 steps. The corresponding process using photolithography to define both the metallization and dielectric layer would require 12 steps.

Materials utilized are substrate and metal. Process steps are metal deposition, metal patterning, and (possibly) metal plate up followed by direct etch manufacture of vertical interconnects (DEVI). When used with a scanning ablation tool, this process is set forth in our co-pending patent application Ser. No. 08/058,906 filed May 6, 1993 entitled APPARATUS AND PROCESS FOR THE PRODUCTION OF FINE LINE METAL TRACES under the subtitle "Etch Enhancement", or alternatively as "Direct Etch Metal Removal".

Substrates utilized can include glass, ceramic, alumina, silicon, glass-ceramic, copper with dielectric coating. Others of course are possible. For simplicity of manufacture (especially for single layer packages), the substrate may already be provided with metal and etch block layers already disposed on it. The preferred embodiment uses alumina. Also, the substrate in general contains both active and passive circuit components such as MOs capacitors, resistors, diodes or transistors.

Metals used include copper, aluminum, CU/AL, gold. Preferred embodiment uses aluminum. In addition to their electrical properties, it is desirable that the metal be capable of withstanding the power levels utilized during subsequent dielectric patterning. This etch stop property of the metal layer allows for wide process latitude since exposure beyond the nominal will not affect the underlying metal layer. Preferred embodiment uses aluminum sufficiently thick (>1 mm) that it serves as an etch stop. The initial layer, however is preferably 0.1 mm thick so that it can be patterned directly with an excimer laser with a single, sufficiently energetic, pulse.

Metal deposition techniques can include sputtering, sputtering followed by plateup, vacuum deposit and plateup, and other known processes. Sputtering alone is preferred.

As before, metal patterning can utilize masks, lensless computer generated holograms (CGH), scanning imaging systems, fixed field step and repeat. Scanning imaging systems are preferred.

To enhance metal etch rates, the metal could be in a liquid or gaseous environment. Since in the preferred arrangement the metal is thin, it can be blown off with a single pulse, provided that the pulse has sufficient fluence.

Again as before, programmable metal patterning can include the use of programmable computer generated holograms (CGH), opto mechanical scan systems, acousto-optic scan systems. Programmable computer generated holograms (CGH) are preferred.

Metal plating, if necessary, can include an electrolytic or electroless process can be used.

As before, the sequence of steps outlined above is repeated as many times as necessary so that the appropriate metal and via structures are obtained. The result of these processes is a single or multi-layer package (See FIG. 6A or 6B) to which chips are then bonded. These process steps have been outlined for producing MCM-D packages. They can also be applied, with suitable modifications, to manufacture of flat panel displays and to microelectronic chips themselves. This process is also capable of making straight or sloped wall vias.

The final step in manufacture involves a repeat of the metallization step (DEMR) resulting in pads to which bare die are mounted to. This much is seen with respect to FIG. 6A.

Figure 6B:
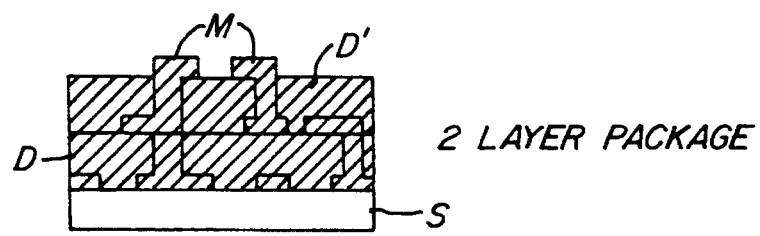

Referring to FIG. 6B, the case of a two layer package is illustrated. In this case a second layer of dielectric D' is illustrated with direct etch manufacture of vertical interconnects (DEVI) including metal plating in the vertical interconnects with pads 20 formed at the top of the upper dielectric layer D'.

The reader will understand that from the above specification that three simplified techniques have been set forth—all eliminating the use of conventional lithography. On the mean, the intensity of light required for the direct ablation of materials is typically hundreds or even thousands times that required for photolithographic techniques. Simply stated, more light energy is required for the processing.

This, however, is more than offset. First, although greater light intensity is involved, the resolution of the features attainable remains comparable. Secondly, and with the reduced number of process steps, all of the advantages listed above follow. As a result, processing as of the date of this filing can be done at levels in the range of 25% of the cost of comparable processing utilizing photolithography.

What is claimed is:

1. A process for the manufacture of multichip modules of the deposited variety having metallic traces in a required circuit pattern comprising the steps of:

providing a substrate;

coating the substrate with metal;

coating metal with etch block;

patterning said etch block to expose said metal in a pattern for removal with remaining etch block overlying metallic traces in the required circuit pattern;

etching the exposed metal to leave etch block overlying metallic traces in the required circuit pattern;

stripping the remaining etch block overlying the blocked metal traces of the required circuit pattern;

coating the patterned metal with dielectric material; and, patterning the dielectric material for forming vertical interconnects.

2. A process for the manufacture of multichip modules of the deposited variety having metallic traces in a required circuit pattern according to claim 1, wherein said substrate is selected from the group consisting of glass, ceramic, alumina, silicon, glass-ceramic, and copper with dielectric coating.

3. A process for the manufacture of multichip modules of the deposited variety having metallic traces in a required circuit pattern according to claim 1 and further comprising the steps of:

providing said substrate with metal and etch block layers already disposed on it.

4. A process for the manufacture of multichip modules of the deposited variety having metallic traces in a required circuit pattern according to claim 1 and further comprising the steps of:

providing said substrate with circuit components selected from the group consisting of active MOS capacitors, passive MOS capacitors, resistors, diodes, and transistors.

5. A process for the manufacture of multichip modules of the deposited variety having metallic traces in a required circuit pattern according to claim 1, wherein:

said metal is selected from the group consisting of copper, aluminum, copper/aluminum, and gold.

6. A process for the manufacture of multichip modules of the deposited variety having metallic traces in a required circuit pattern according to claim 1 and further comprising the steps of:

coating the substrate with metal includes coating said metal sufficiently thick to be capable of withstanding the patterning utilized during etch block.

7. A process for the manufacture of multichip modules of the deposited variety having metallic traces in a required circuit pattern according to claim 1, wherein said metal is applied using a process selected from the group consisting of:

sputter coating and plating.

8. A process for the manufacture of multichip modules of the deposited variety having metallic traces in a required circuit pattern according to claim 1, wherein said etch block is selected from the group consisting of screen ink, shellac, polyvinylidene chloride, photoresist, polyimide, photoimageable polyimide, benzocyclobutene, and polyphenylquinoxaline.

9. A process for the manufacture of multichip modules of the deposited variety having metallic traces in a required circuit pattern according to claim 1 and further comprising the steps of:

said patterning of said etch block step includes,
providing a mask having a pattern for said etch block; and,
projecting light through said mask to pattern said etch block.

10. A process for the manufacture of multichip modules of the deposited variety having metallic traces in a required circuit pattern according to claim 9, wherein:

said mask is selected from the group consisting of dielectric coated masks, chrome coated masks, iron oxide coated masks, transparent masks having phase shifting portions, full aperture computer generated holograms, and subaperture computer generated holograms.

11. A process for the manufacture of multichip modules of the deposited variety having metallic traces in a required circuit pattern according to claim 9, wherein said light is projected using a process:

selected from the group consisting of moving said light in a programmable pattern, addressing a computer generated hologram having subapertures one aperture at a time, addressing a computer generated hologram having subapertures a group of subapertures at a time, raster scanning a laser, and vector scanning a laser.

12. A process for the manufacture of multichip modules of the deposited variety having metallic traces in a required circuit pattern according to claim 1, wherein:

said etching step utilizes a technique selected from the group consisting of a wet etch process and a dry etch process.

13. A process for the manufacture of multichip modules of the deposited variety having metallic traces in a required circuit pattern according to claim 1, wherein:

said remaining etch block is stripped using a technique selected from the group consisting of wet etching and dry etching.

14. A process for the manufacture of multichip modules of the deposited variety having metallic traces in a required circuit pattern according to claim 1, wherein said etch block is applied to said metal using a process:

selected from the group consisting of squeegee application, spin coating, spray coating, and screen application.

15. A process for the manufacture of multichip modules of the deposited variety having metallic traces in a required circuit pattern according to claim 1, wherein:

said patterning of said dielectric uses a technique selected from the group consisting of a scanning image system, an image system including computer generated hologram, an image system including subaperture computer generated hologram, an image system including a dielectric coated mask, and a step and repeat imaging system.

16. A process for the manufacture of multichip modules of the deposited variety having metallic traces in a required circuit pattern according to claim 1, wherein:

said dielectric material is selected from the group consisting of polyamide and benzocyclobutene.

17. A process for the manufacture of multichip modules of the deposited variety having metallic traces in a required circuit pattern according to claim 1 and further comprising the steps of:

said patterning of said dielectric includes
providing a mask having a pattern for said dielectric material; and,
projecting light through said mask to pattern said dielectric material.

18. A process for the manufacture of multichip modules of the deposited variety having metallic traces in a required circuit pattern according to claim 17, wherein:

said mask is selected from the group consisting of dielectric coated masks, chrome coated masks, iron oxide coated masks, transparent masks having phase shifting portions, full aperture computer generated holograms, and subaperture computer generated holograms.

19. A process for the manufacture of multichip modules of the deposited variety having metallic traces in a required circuit pattern according to claim 17, wherein said light is projected using a process:

selected from the group consisting of moving said light in a programmable pattern, addressing a computer generated hologram having subapertures one aperture at a time, addressing a computer generated hologram having subapertures a group of subapertures at a time, raster scanning a laser, and vector scanning a laser.

20. A process for the manufacture of multichip modules of the deposited variety having metallic traces in a required circuit pattern comprising the steps of:

providing a substrate;

coating the substrate with continuous blanket metal layer;

directly patterning said metal layer to ablate said metal in a circuit pattern;

coating the patterned metal with dielectric material; and patterning the dielectric material for forming vertical interconnects.

21. A process for the manufacture of multichip modules of the deposited variety having metallic traces in a required circuit pattern according to claim 20, wherein:

said substrate is selected from the group consisting of glass, ceramic, alumina, silicon, glass-ceramic, and copper with dielectric coating.

22. A process for the manufacture of multichip modules of the deposited variety having metallic traces in a required circuit pattern according to claim 20 and further comprising the steps of:

providing said substrate with said metal layer already disposed on it.

23. A process for the manufacture of multichip modules of the deposited variety having metallic traces in a required circuit pattern according to claim 20 and further comprising the steps of:

providing said substrate with circuit components selected from the group consisting of active MOS capacitors, passive MOS capacitors, resistors, diodes, and transistors.

24. A process for the manufacture of multichip modules of the deposited variety having metallic traces in a required circuit pattern according to claim 20, wherein:

said metal is selected from the group consisting of copper, aluminum, copper/aluminum, and gold.

25. A process for the manufacture of multichip modules of the deposited variety having metallic traces in a required circuit pattern according to claim 20, wherein said metal is applied using a process selected from the group consisting of sputter coating and plating.

26. A process for the manufacture of multichip modules of the deposited variety having metallic traces in a required circuit pattern according to claim 20, wherein:

said patterning of said metal layer uses a technique selected from the group consisting of a scanning image system, computer generated hologram, subaperture computer generated hologram, a dielectric coated mask, and a step and repeat imaging system.

27. A process for the manufacture of multichip modules of the deposited variety having metallic traces in a required circuit pattern according to claim 20, wherein:

said dielectric material is selected from the group consisting of polyamide and benzocyclobutene.

28. A process for the manufacture of multichip modules of the deposited variety having metallic traces in a required circuit pattern according to claim 20 and further comprising the steps of:

said patterning of said dielectric includes
providing a mask having a pattern for said dielectric material; and,
projecting light through said mask to pattern said dielectric material.

29. A process for the manufacture of multichip modules of the deposited variety having metallic traces in a required circuit pattern according to claim 28, wherein:

said mask is selected from the group consisting of dielectric coated masks, chrome coated masks, iron oxide coated masks, transparent masks having phase shifting portions, full aperture computer generated holograms, and subaperture computer generated holograms.

30. A process for the manufacture of multichip modules of the deposited variety having metallic traces in a required circuit pattern according to claim 20, wherein said light is projected using a technique:

selected from the group consisting of moving said light in a programmable pattern, addressing a computer generated hologram having subapertures one aperture at a time, addressing a computer generated hologram having subapertures a group of subapertures at a time, raster scanning a laser, and vector scanning a laser.

31. A process for the manufacture of multichip modules of the deposited variety having metallic traces in a required circuit pattern comprising the steps of:

providing a substrate;
coating the substrate with a blanket metal layer;
coating the blanket metal layer with a blanket layer plating form;
patterning said blanket layer plating form;
plating up the exposed parts of the blanket metal layer;
stripping the remaining plating form;
etching back the plated up metal layer;
coating the patterned metal with dielectric material; and,
patterning the dielectric material for forming vertical interconnects.

32. A process for the manufacture of multichip modules of the deposited variety having metallic traces in a required circuit pattern according to claim 31, wherein:

said substrate is selected from the group consisting of glass, ceramic, alumina, silicon, glass-ceramic, and copper with dielectric coating.

33. A process for the manufacture of multichip modules of the deposited variety having metallic traces in a required circuit pattern according to claim 31 and further comprising the steps of:

providing said substrate with metal and plating form layers already disposed on it.

34. A process for the manufacture of multichip modules of the deposited variety having metallic traces in a required circuit pattern according to claim 31 and further comprising the steps of:

providing said substrate with circuit components selected from the group consisting of active MOS capacitors, passive MOS capacitors, resistors, diodes, and transistors.

35. A process for the manufacture of multichip modules of the deposited variety having metallic traces in a required circuit pattern according to claim 31, wherein:

said metal is selected from the group consisting of copper, aluminum, copper/aluminum, and gold.

36. A process for the manufacture of multichip modules of the deposited variety having metallic traces in a required circuit pattern according to claim 31, wherein:

said plating form is selected from the group consisting of photoresist, photoimageable polyimide, and ink.

37. A process for the manufacture of multichip modules of the deposited variety having metallic traces in a required circuit pattern according to claim 31, wherein:

said plating form is applied using a technique selected from the group consisting of spin coating and spray coating.

38. A process for the manufacture of multichip modules of the deposited variety having metallic traces in a required circuit pattern according to claim 31 and further comprising the steps of:

said patterning of said blanket layer step includes,
providing a mask having a pattern for said etch block; and,
projecting light through said mask to pattern said etch block.

39. A process for the manufacture of multichip modules of the deposited variety having metallic traces in a required circuit pattern according to claim 38, wherein:

said mask is selected from the group consisting of dielectric coated masks, chrome coated masks, iron oxide coated masks, transparent masks having phase shifting portions, full aperture computer generated holograms, and subaperature computer generated holograms.

40. A process for the manufacture of multichip modules of the deposited variety having metallic traces in a required circuit pattern according to claim 38, wherein:

said projecting step is selected from the group consisting of moving said light in a programmable pattern, addressing a computer generated hologram having subapertures one aperture at a time, addressing a computer generated hologram having subapertures a group of subapertures at a time, raster scanning a laser, and vector scanning a laser.

41. A process for the manufacture of multichip modules of the deposited variety having metallic traces in a required circuit pattern according to claim 31, wherein:

said plating up step utilizes a technique selected from the group consisting of electroless plating and electrolytic plating.

42. A process for the manufacture of multichip modules of the deposited variety having metallic traces in a required circuit pattern according to claim 31, wherein:

said stripping step utilizes a technique selected from the group consisting of a wet chemical process and a dry chemical process.

43. A process for the manufacture of multichip modules of the deposited variety having metallic traces in a required circuit pattern according to claim 31, wherein:

said etching step utilizes a technique selected from the group consisting of a dry etch process and a wet etch process.

44. A process for the manufacture of multichip modules of the deposited variety having metallic traces in a required circuit pattern according to claim 31, wherein:

said dielectric material is selected from the group consisting of polyamide and benzocyclobutene.

45. A process for the manufacture of multichip modules of the deposited variety having metallic traces in a required circuit pattern according to claim 37 and further comprising the steps of:

said patterning of said dielectric includes
providing a mask having a pattern for said dielectric material; and,
projecting light through said mask to pattern said dielectric material.

46. A process for the manufacture of multichip modules of the deposited variety having metallic traces in a required circuit pattern according to claim 45, wherein:

said mask is selected from the group consisting of dielectric coated masks, chrome coated masks, iron oxide coated masks, transparent masks having phase shifting portions, full aperture computer generated holograms, and subaperture computer generated holograms.

47. A process for the manufacture of multichip modules of the deposited variety having metallic traces in a required circuit pattern according to claim 45, wherein said light is projected using a process:

selected from the group consisting of moving said light in a programmable pattern, addressing a computer generated hologram having subapertures one aperture at a time, addressing a computer generated hologram having subapertures a group of subapertures at a time, raster scanning a laser, and vector scanning a laser.

48. A process for the manufacture of multichip modules of the deposited variety having metallic traces in a required circuit pattern comprising the steps of:

providing a substrate;

coating the substrate with metal;

coating metal with etch block;

patterning said etch block to expose said metal in a pattern for removal with remaining etch block overlying metallic traces in the required circuit pattern;

etching the exposed metal to leave etch block overlying metallic traces in the required circuit pattern; and stripping the remaining etch block overlying the blocked metal traces of the required circuit pattern.

49. A process for the manufacture of multichip modules of the deposited variety having metallic traces in a required circuit pattern comprising the steps of:

providing a substrate;

coating the substrate with a metal layer; and directly patterning said metal layer to ablate said metal in a circuit pattern.

50. A process for the manufacture of multichip modules of the deposited variety having metallic traces in a required circuit pattern comprising the steps of:

providing a substrate;

coating the substrate with a metal layer;

coating said metal layer with a blanket layer plating form;

patterning said blanket layer plating form;

plating up the exposed parts of the metal layer;

stripping the remaining plating form; and etching back the plated up metal layer.

\* \* \* \* \*